United States Patent
Allen et al.

(10) Patent No.: US 10,593,768 B2
(45) Date of Patent: Mar. 17, 2020

(54) APPARATUS COMPRISING TWO DIMENSIONAL MATERIAL

(71) Applicant: NOKIA TECHNOLOGIES OY, Espoo (FI)

(72) Inventors: Mark Allen, Great Cambourne (GB); Richard White, Cambridge (GB)

(73) Assignee: NOKIA TECHNOLOGIES OY, Espoo (FI)

( * ) Notice: Subject to any disclaimer, the term of this patent is extended or adjusted under 35 U.S.C. 154(b) by 0 days.

(21) Appl. No.: 16/090,974

(22) PCT Filed: Mar. 28, 2017

(86) PCT No.: PCT/FI2017/050214
§ 371 (c)(1),
(2) Date: Oct. 3, 2018

(87) PCT Pub. No.: WO2017/178695
PCT Pub. Date: Oct. 19, 2017

(65) Prior Publication Data
US 2019/0140060 A1 May 9, 2019

(30) Foreign Application Priority Data

Apr. 13, 2016 (EP) ..................................... 16165147

(51) Int. Cl.
*H01L 29/06* (2006.01)
*H01L 29/41* (2006.01)
(Continued)

(52) U.S. Cl.
CPC ............ *H01L 29/413* (2013.01); *B82Y 10/00* (2013.01); *B82Y 15/00* (2013.01); *B82Y 40/00* (2013.01);
(Continued)

(58) Field of Classification Search
CPC ............... H01L 29/127; H01L 29/1606; H01L 29/41725; H01L 29/41733; H01L 29/66045
See application file for complete search history.

(56) References Cited

U.S. PATENT DOCUMENTS

| 2007/0132043 A1* | 6/2007 | Bradley | ................. | B82Y 10/00 |
| | | | | 257/414 |
| 2010/0117076 A1* | 5/2010 | Akimoto | ........... | H01L 29/66969 |
| | | | | 257/43 |

(Continued)

FOREIGN PATENT DOCUMENTS

| WO | WO2014162055 | 10/2014 |
| WO | WO2016042210 | 3/2016 |

OTHER PUBLICATIONS

Yumi Ahn et al.; "Cooper Nanowire-Graphene Core-Shell Nanostructure for Highly Stable Transparent Conducting Electrodes", ACS Nano; vol. 9, No. 3, (Mar. 24, 2015); pp. 3125-3133.
(Continued)

*Primary Examiner* — Phuc T Dang
(74) *Attorney, Agent, or Firm* — McCracken & Gillen LLC

(57) ABSTRACT

An apparatus and method, the apparatus comprising: at least one electrode configured to provide an electrical connection to a channel of two dimensional material wherein the electrode comprises a conductive layer and plurality of nanostructures wherein at least some of the nanostructures comprise a conductive core and a coating of two dimensional material.

14 Claims, 4 Drawing Sheets

(51) Int. Cl.
   *H01L 29/417*     (2006.01)
   *H01L 29/45*      (2006.01)
   *H01L 31/028*     (2006.01)
   *H01L 31/0352*    (2006.01)
   *H01L 29/16*      (2006.01)
   *B82Y 15/00*      (2011.01)
   *H01L 29/778*     (2006.01)
   *B82Y 40/00*      (2011.01)
   *H01L 29/66*      (2006.01)
   *H01L 29/12*      (2006.01)
   *B82Y 10/00*      (2011.01)
   *H01L 31/0224*    (2006.01)
   *H01L 31/0232*    (2014.01)
   *H01L 31/10*      (2006.01)

(52) U.S. Cl.
   CPC ........ *H01L 29/127* (2013.01); *H01L 29/1606* (2013.01); *H01L 29/41725* (2013.01); *H01L 29/41733* (2013.01); *H01L 29/45* (2013.01); *H01L 29/66045* (2013.01); *H01L 29/778* (2013.01); *H01L 31/028* (2013.01); *H01L 31/0224* (2013.01); *H01L 31/0232* (2013.01); *H01L 31/022408* (2013.01); *H01L 31/022416* (2013.01); *H01L 31/035218* (2013.01); *H01L 31/10* (2013.01)

(56) References Cited

U.S. PATENT DOCUMENTS

| | | |
|---|---|---|
| 2010/0258787 A1 | 10/2010 | Chae et al. |
| 2015/0137074 A1 | 5/2015 | Lee et al. |
| 2015/0144884 A1 | 5/2015 | Yamaguchi et al. |
| 2016/0351847 A1* | 12/2016 | Wu ............ H01L 51/5234 |
| 2017/0015975 A1* | 1/2017 | Fu ............ C12N 5/0068 |

OTHER PUBLICATIONS

Yu-Chia Liang et al.; "Solid-State Microwave-Arcing-Induced Formation and Surface Functionalization of Core/Shell Metal/Carbon Nanoparticles", Small, vol. 4, No. 4, (Apr. 1, 2008); pp. 405-409.

* cited by examiner

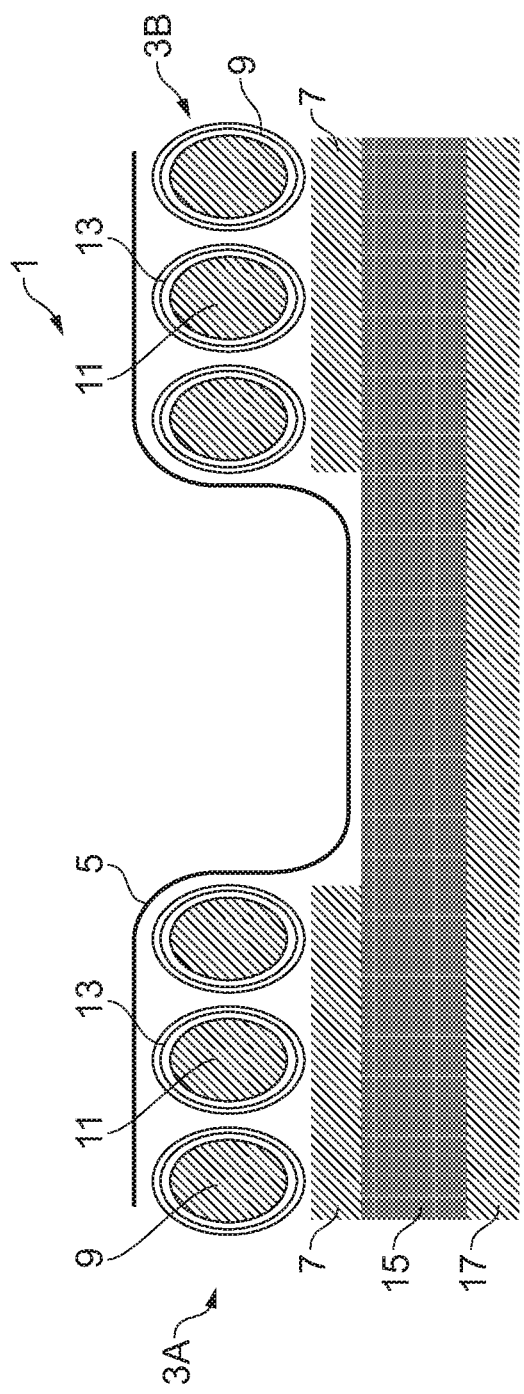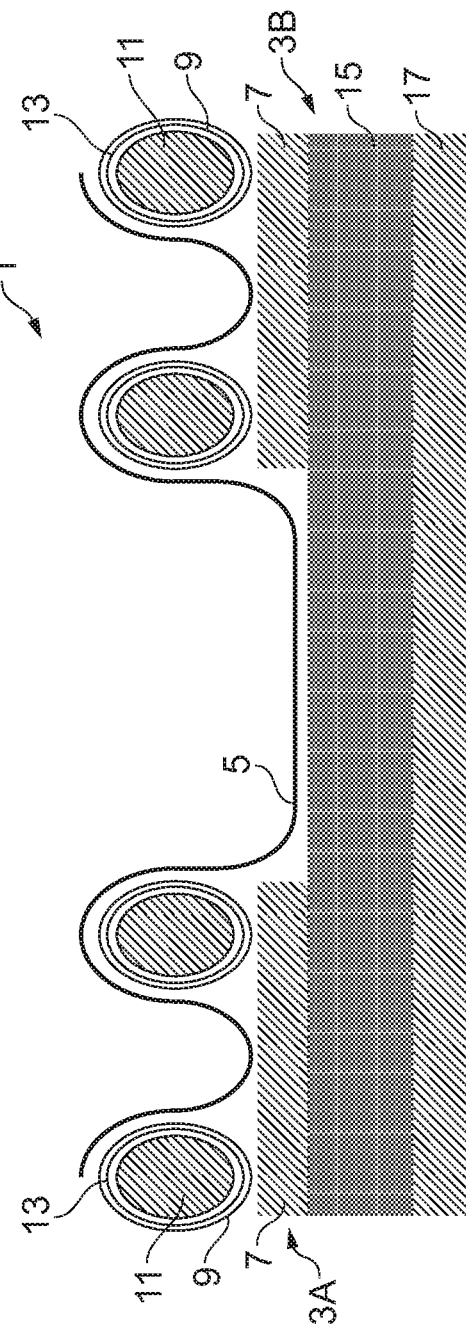

APPARATUS COMPRISING TWO DIMENSIONAL MATERIAL

TECHNOLOGICAL FIELD

Examples of the disclosure relate to an apparatus and method of forming an apparatus wherein the apparatus comprises two dimensional material. In particular, examples of the disclosure relate to an apparatus and method of forming an apparatus comprising one or more electrodes coupled to a channel of two dimensional material.

BACKGROUND

Electronic apparatus comprising two dimensional materials such as graphene are known. Such apparatus comprise electrodes arranged to provide an electrical connection to the two dimensional material. This electrical connection requires charge transfer between the three dimensional material of the electrodes and the two dimensional material.

It is useful to provide apparatus with an improved electrodes for connection to a two dimensional material.

BRIEF SUMMARY

According to various, but not necessarily all, examples of the disclosure there is provided an apparatus comprising: at least one electrode configured to provide an electrical connection to a channel of two dimensional material wherein the electrode comprises a conductive layer and plurality of nanostructures wherein at least some of the nanostructures comprise a conductive core and a coating of two dimensional material.

The conductive layer may comprise metal.

The conductive core of at least some of the nanostructures may comprise metal.

The nanostructures may comprise at least one of: nanoparticles, nanowires.

The coating of two dimensional material may be formed on the conductive core of at least some of the nanostructures.

The channel of two dimensional material and the coating of two dimensional material may both comprise graphene.

The nanostructures may be provided overlaying the conductive layer. The channel of two dimensional material may be provided overlaying the nanostructures.

The conductive layer may be provided overlaying the nanostructures. The nanostructures may be provided overlaying the channel of two dimensional material.

The apparatus may comprise a first electrode and a second electrode. The channel of two dimensional material may extend between the first electrode and the second electrode and a further plurality of nanostructures may be provided between the electrodes and in contact with the channel of two dimensional material.

The apparatus may comprise quantum dots.

The quantum dots may be provided overlaying the channel of two dimensional material in the region between the first electrode and the second electrode.

According to various, but not necessarily all, examples of the disclosure there is provided a sensing device comprising an apparatus as described above.

According to various, but not necessarily all, examples of the disclosure there is provided a method comprising: forming at least one electrode wherein the electrode comprises a conductive layer and plurality of nanostructures wherein at least some of the nanostructures comprise a conductive core and a coating of two dimensional material; and configuring the at least one electrode to provide an electrical connection to a channel of two dimensional material.

The conductive layer may comprise metal.

The conductive core of at least some of the nanostructures may comprise metal.

The nanostructures may comprise at least one of: nanoparticles, nanowires.

The coating of two dimensional material may be formed on the conductive core of at least some of the nanostructures.

The channel of two dimensional material and the coating of two dimensional material may both comprise graphene.

The method may comprise providing the nanostructures overlaying the conductive layer. The method may comprise providing the channel of two dimensional material overlaying the nanostructures.

The method may comprise providing the conductive layer overlaying the nanostructures. The method may comprise providing the nanostructures overlaying the channel of two dimensional material.

The method may comprise providing a first electrode and a second electrode.

The channel of two dimensional material may extend between the first electrode and the second electrode and the method may comprise providing a further plurality of nanostructures between the electrodes and in contact with channel of two dimensional material.

The method may comprise providing one or more quantum dots. The quantum dots may be provided overlaying the channel of two dimensional material in the region between the first electrode and the second electrode.

According to various, but not necessarily all, embodiments of the invention there is provided examples as claimed in the appended claims.

BRIEF DESCRIPTION

For a better understanding of various examples that are useful for understanding the detailed description, reference will now be made by way of example only to the accompanying drawings in which:

FIG. 3 illustrates another apparatus;

FIG. 4 illustrates another apparatus;

DETAILED DESCRIPTION

Figure 1:
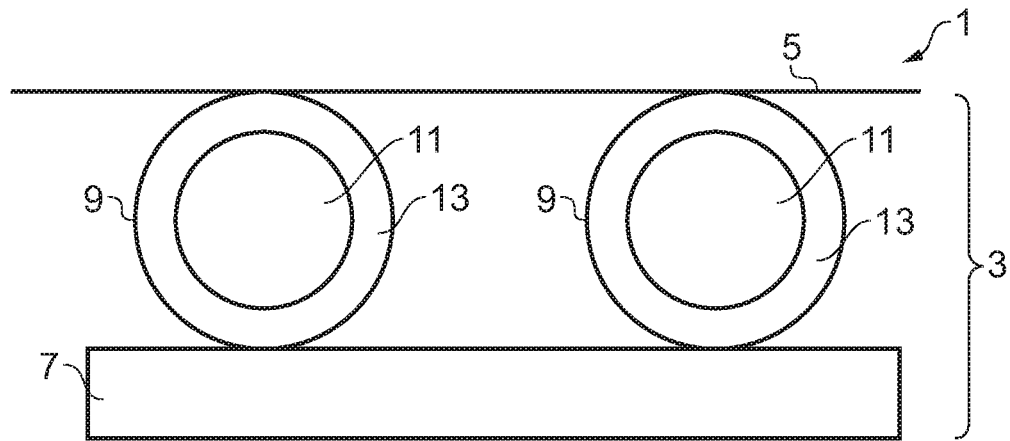
FIG. 1 illustrates an apparatus.

The Figures illustrate an apparatus 1 and method of forming an apparatus 1. The apparatus comprises at least one electrode 3 configured to provide an electrical connection to a channel 5 of two dimensional material wherein the electrode 3 comprises a conductive layer 7 and plurality of nanostructures 9 wherein at least some of the nanostructures 9 comprise a conductive core 11 and a coating 13 of two dimensional material.

The apparatus 1 may be used in any electronic device which comprises a channel 5 of two dimensional material. The apparatus 1 may be used for sensing or any other suitable application.

FIG. 1 illustrates an apparatus 1 according to examples of the disclosure. The apparatus 1 comprises at least one electrode 3 and a channel 5 of two dimensional material.

The electrode 3 is configured to provide an electrical connection to the channel 5 of two dimensional material. The electrode 3 is configured for charge transfer between the electrode 3 and the channel 5 of two dimensional material. The electrode 3 may be configured to provide a direct current path between the electrode 3 and the channel 5 of two dimensional material.

The electrode 3 comprises a conductive layer 7 and a plurality of nanostructures 9. In the example of FIG. 1 the nanostructures 9 are arranged overlaying the conductive layer 7. Other arrangements of the conductive layer 7 and the plurality of nanostructures 9 may be used in other examples of the disclosure.

The conductive layer 7 may comprise a conductive material such as chromium, gold or any other suitable material. The conductive layer 7 comprises a three dimensional material.

The nanostructures 9 may comprise nanoparticles, nanowires or any other suitable nanostructures. The nanoparticles may comprise spherical or substantially spherical structures. The nanowires may comprise elongate structures. The elongate structures may have a circular cross section. Other types of nanostructures may be used in other examples of the disclosure.

The nanostructures may be of any suitable size. The size of the nanostructures may range from a few nanometers up to around 100 nanometers.

The nanostructures 9 comprise a conductive core 11 and a coating 13 of two dimensional material. In some examples each of the nanostructures 9 may comprise a conductive core 11 and a coating 13 of two dimensional material. In some examples at least some of the nanostructures 9 may comprise a conductive core 11 and a coating 13 of two dimensional material.

The conductive core 11 may comprise a conductive material such as copper or any other suitable metal. In some examples the metal that is used may also be suitable for directly growing the coating 13 of two dimensional material. The material that is used for the conductive core 11 may be selected to reduce the work function between the conducive core 11 and the coating 13 of two dimensional material. In some examples the conductive core 11 may comprise the same type of metal as the conductive layer 7. In other examples different metals could be used for the conductive core 11 and the conductive layer 7.

The coating 13 of two dimensional material comprises the same type of material as is used in the channel 5 of two dimensional material. In some examples the two dimensional material may comprise graphene. In other examples the coating 13 of two dimensional material may comprise a different material to the channel 5 of two dimensional material.

The coating 13 may comprise a monolayer of two dimensional material or a small number of layers of two dimensional material. The coating 13 may have a thickness of less than 1 nm.

The coating 13 may be provided directly on the conductive core 11 so that there are no intervening layers between the conductive core 11 and the coating 13 of two dimensional material. In some examples the coating 13 of two dimensional material may be formed on the surface of the conductive core 11. As the coating 13 is formed on the surface of the conductive core 11 this reduces the opportunity for residue and other contaminants to be introduced into the coating 13. This may ensure that there is good electrical contact between the conductive core 11 and the coating 13 of two dimensional material.

The coating 13 may extend around the entire circumference of the conductive core 11. This may increase the area of conductive material which is in contact with the two dimensional material of the coating 13.

The channel 5 of two dimensional material may comprise graphene or any other suitable material. The channel 5 of two dimensional material may be provided in a thin layer. In some examples the channel 5 of two dimensional material may have a thickness in the range of nanometers. In some examples the channel 5 of two dimensional material may comprise an atomic monolayer.

In the example apparatus 1 of FIG. 1 the channel 5 of two dimensional material is provided overlaying the nanostructures 9 of the electrode 3. The channel 5 of two dimensional material is provided overlaying the nanostructures 9 so that the channel 5 of two dimensional material is in direct contact with the coating 13 of two dimensional material.

The channel 5 of two dimensional material may be provided between source and drain electrodes. The channel 5 of two dimensional material may be provided as a channel in a field effect transistor or other sensing device.

Figure 2:
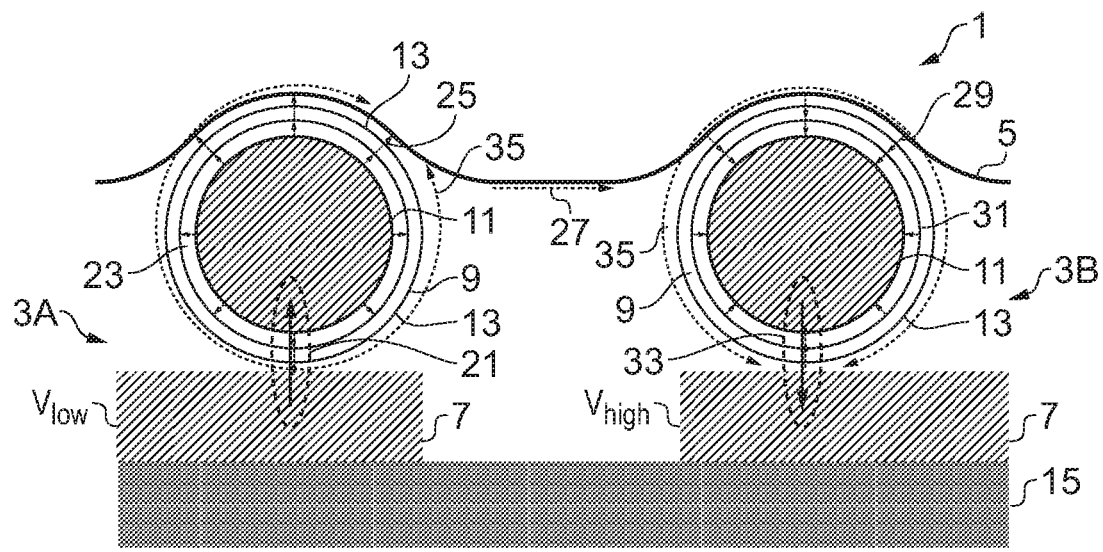
FIG. 2 illustrates electronic coupling within an apparatus.

FIG. 2 illustrates electronic coupling within an example apparatus 1. In the example of FIG. 2 the apparatus 1 comprises a first electrode 3A and a second electrode 3B which may be as described above in relation to FIG. 1. A channel 5 of two dimensional material extends between the first electrode 3A and the second electrode 3B. In the example of FIG. 2 only one nanostructure 9 is illustrated in each electrode 3A, 3B for clarity. However it is to be appreciated that the electrodes 3A, 3B may each comprise a plurality of nanostructures 9.

In the example of FIG. 2 the electrodes are provided on a substrate. The substrate may comprise a layer of dielectric 15 or any other suitable material.

In the example of FIG. 2 the first electrode 3A has a first electrical potential $V_{low}$ and the second electrode 3B has a second electrical potential $V_{high}$. In the example of FIG. 2 the first electrode 3A has a lower electric potential than the second electrode 3B. The first electrode 3A may provide a source electrode and the second electrode 3B may provide a drain electrode. This arrangement could be reversed in other examples of the disclosure. The channel 5 of two dimensional material extends between the first electrode 3A and the second electrode 3B.

In the example of FIG. 2 the nanostructures 9 are provided overlaying the conductive layer 7. The conductive core 11 of the nanostructures 9 is only separated from the conductive layer 7 by the thickness of the coating 13. As the coating 13 is only an atomic monolayer or a small number of atomic monolayers the conductive core 11 is provided at the same electrical potential as the conductive layer 7. The coating 13 only provides a small energy barrier between the conductive layer 7 and the conductive core 11. This enables electrons to pass from the conductive layer 7 to the conductive core 11 via electron tunnelling as indicated by the arrow 21.

Electrons from the conductive core 11 are then injected into the coating 13 of two dimensional material as indicated by the arrows 23. The injection of electrons from the conductive core 11 into the coating 13 of two dimensional material may occur at any point where the conductive core 11 is in contact with the coating 13 or where the conductive core 11 is within tunnelling distance of the coating. As the coating 13 is provided around the circumference of the conductive core 11 this provides a large surface area for the transfer of electrons between the conductive core 11 and the coating 13.

Electrons from the coating 13 are then transferred to the channel 5 of two dimensional material as indicated by the arrows 25. As the channel 5 of two dimensional material comprises the same material as the coating 13 they have a similar density of states. This allows for efficient charge transport between the coating 13 and the channel 5 of two dimensional material.

Electrons are then transferred though the channel 5 towards the second electrode 3B as indicated by the arrow 27. At the second electrode 3B the electrons are transferred from the channel 5 to the coating 13 of the nanostructures 9 in the second electrode 3B as indicated by the arrows 29.

The nanostructures 9 in the second electrode 3B also have the coating 13 provided around the surface of the conductive core 11 to provide a large surface area for the transfer of electrons between the conductive core 11 and the coating 13. This allows for electrons to be transferred from the coating 13 to the conductive core 11 as indicated by arrow 31. The electrons from the conductive core 11 can then be transferred to the conductive layer 7 by electron tunnelling as indicated by the arrow 33.

Therefore the examples of the disclosure provide for efficient electron transfer between a channel 5 of two dimensional material and electrodes 3 comprising a three dimensional material.

It is to be appreciated that there would also be some charge transfer directly between the conductive layer 7 and the channel 5 of two dimensional material as indicated by the arrows 35.

FIG. 3 illustrates another example apparatus 1 according to examples of the disclosure. The apparatus 1 comprises a source electrode 3A, a drain electrode 3B and a gate electrode 17. In the example of FIG. 3 the channel 5 of two dimensional material comprises graphene. In the example apparatus of FIG. 3 the electrodes 3A, 3B, 17 and the channel 5 of two dimensional material are configured as a graphene field effect transistor (GFET).

The source electrode 3A and drain electrode 3B comprise a conductive layer 7 and a plurality of nanostructures 9 which may be as described above. The gate electrode 17 may comprise a conductive material such as metal or any other suitable material. A layer of dielectric 15 is provided between the gate electrode 17 and the source electrode 3A and the drain electrode 3B. The layer of dielectric 15 may comprise any suitable insulating material. The layer of dielectric material 15 may be configured to prevent a short circuit between the gate electrode 17 and the conductive layers 7 of the source electrode 3A and drain electrode 3B.

In the example of FIG. 3 the coating 13 of two dimensional material may be grown directly on the surface of the conductive cores 11 of the nanostructures 9. The nanostructures 9 may then be transferred to the conductive layer 7 of the electrodes 3A, 3B. The channel 5 of two dimensional material may be grown on a different substrate and may be transferred to the electrodes 3A, 3B after the nanostructures 9 have been deposited.

FIG. 4 illustrates another apparatus 1 which is similar to the apparatus 1 of FIG. 3. The example apparatus of FIG. 4 also comprises a source electrode 3A, a drain electrode 3B and a gate electrode 17 and a channel 5 of two dimensional material configured to provide a GFET.

In the example of FIG. 4 the plurality of nanostructures 9 within the source and drain electrodes 3A, 3B have a lower packing density than in the example apparatus 1 of FIG. 1. Even with a low packing density the contact resistance between the electrodes 3A, 3B and the channel 5 of two dimensional material is improved compared to a direct connection between the conductive layer 7 and the channel 5 of two dimensional material.

Figure 5:
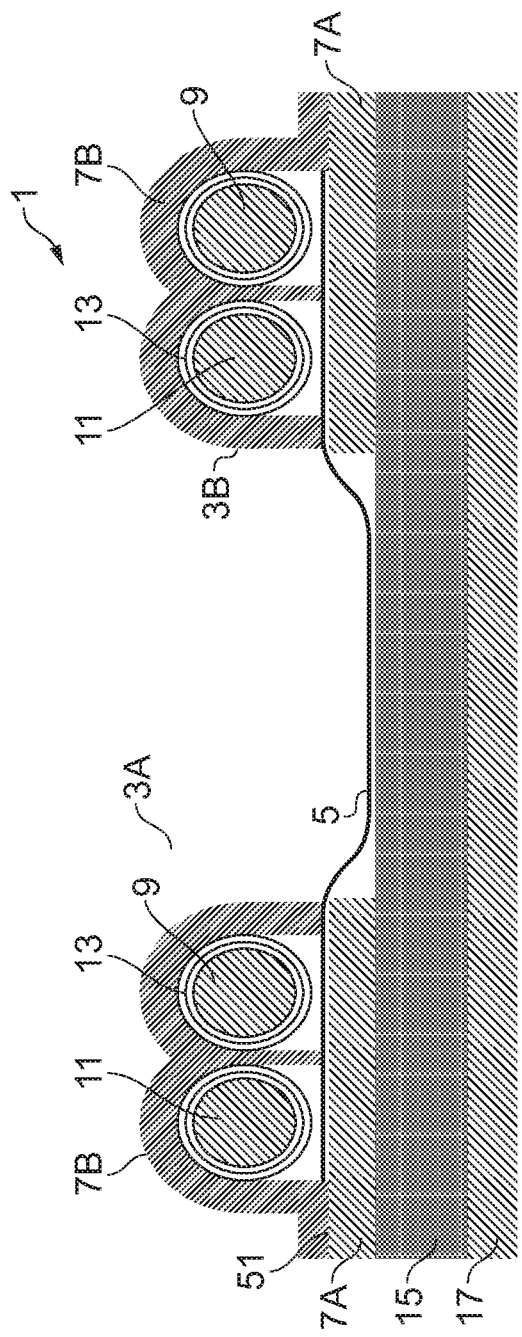
FIG. 5 illustrates another apparatus.

FIG. 5 illustrates another example apparatus 1. The example apparatus of FIG. 5 also comprises a source electrode 3A, a drain electrode 3B and a gate electrode 17 and a channel 5 of two dimensional material configured to provide a GFET.

In the example apparatus 1 of FIG. 5 the source electrode 3A and the drain electrode 3B are configured with the nanostructures 9 provided overlaying the channel 5 of two dimensional material and a conductive layer 7 provided overlaying the plurality of nanostructures 9.

In the example of FIG. 5 the source electrode 3A and the drain electrode 3B comprise a first conductive layer 7A and a second conductive layer 7B. The conductive layers 7A, 7B may comprise a conductive material such as metal or any other suitable material. In some examples the first conductive layer 7A and the second conductive layer 7B may comprise the same material. In other examples different materials may be used for the different conductive layers 7A, 7B.

The first conductive layer 7A is provided on the surface of the dielectric 15. The channel 5 of two dimensional material is then provided overlaying the first conductive layer 7A. This channel 5 of two dimensional material is in direct contact with the first conductive layer 7A. This may enable charge transfer directly between the first conductive layer 7A and the channel 5 of two dimensional material.

The channel 5 of two dimensional material may be grown on a different substrate and then transferred to overlay the first conductive layer 7A and the dielectric 15. In other examples the channel 5 of two dimensional material could be grown directly on the first conductive layer 7A and the dielectric 15.

A plurality of nanostructures 9 are provided overlaying the channel 5 of two dimensional material. In the example of FIG. 5 the plurality of nanostructures 9 are provided in the region of the channel 5 which overlays the first conductive layer 7A. The plurality of nanostructures 9 are positioned so that portions of the channel 5 of two dimensional material are provided between the first conductive layer 7A and the plurality of nanostructures 9. The nanostructures 9 comprise a conductive core 11 and a coating 13 of two dimensional material as described above.

A second conductive layer 7B is provided overlaying the plurality of nanostructures 9. In the example of FIG. 5 the second conductive layer 7B is deposited over the plurality of nanostructures 9 so that portions of the second conductive layer 7B extend between the plurality of nanostructures 9. This may increase the contact surface area between the plurality of nanostructures 9 and the second conductive layer 7B.

The second conductive layer 7B is provided in contact with the first conductive layer 7A. At least one contact point 51 is provided between the first conductive layer 7A and the second conductive layer 7B. The contact point may provide a short between the first conductive layer 7A and the second conductive layer 7B.

The electron transport between the conductive layers 7A, 7B and the channel 5 of two dimensional material may occur as described above. The example apparatus 1 of FIG. 5 may provide an increased contact area between the two dimensional material and the conductive materials compared to the arrangements of FIGS. 3 and 4. This may provide an improved contact resistance and allow for more efficient charge transfer. Having the plurality of nanostructures 9 sandwiched between a first conductive layer 7A and a second conductive layer 7B may ensure that conductive cores 11 of the nanostructures 9 are at the same electrical potential as the conductive layers 7A, 7B. This may provide for improved tunnelling between the conductive layers 7A, 7B and the nanostructures 9.

Figure 6:
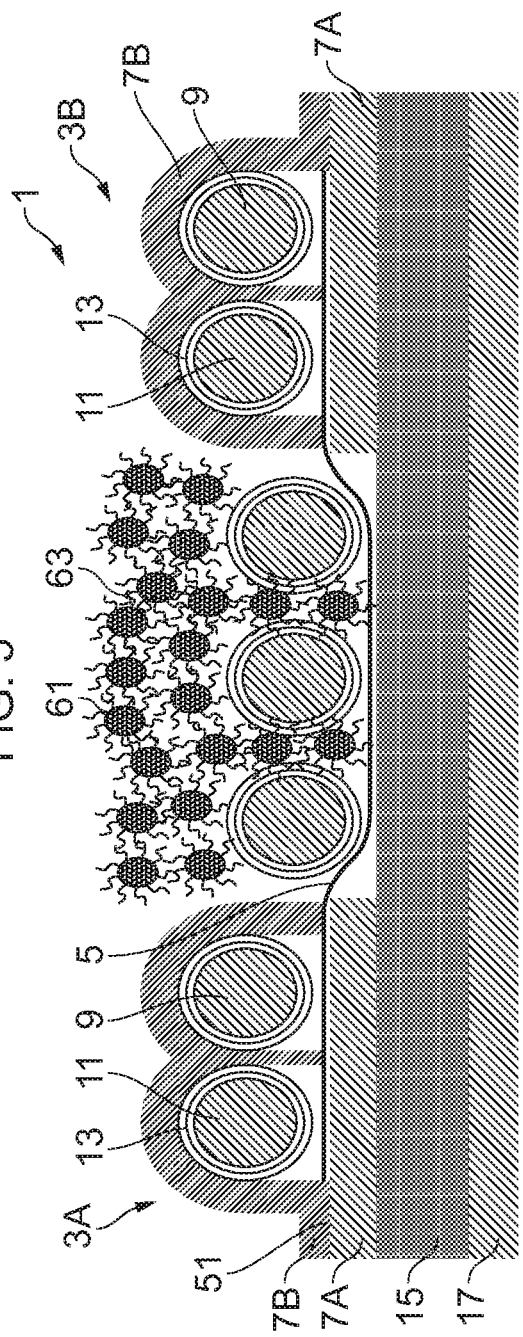
FIG. 6 illustrates an apparatus comprising quantum dots.

FIG. 6 illustrates another example apparatus 1. The example apparatus of FIG. 6 also comprises a source electrode 3A, a drain electrode 3B and a gate electrode 17 and a channel 5 of two dimensional material configured to provide a GFET. In the example apparatus 1 of FIG. 6 the first electrode 3A and the second electrode 3B comprise a first conductive layer 7A and a second conductive layer 7B as described above in relation to FIG. 5. It is to be appreciated that other arrangements of the electrodes 3A, 3B may be used in other examples of the disclosure.

In the example of FIG. 6 the channel 5 of two dimensional material extends between the first electrode 3A and the second electrode 3B and a plurality of nanostructures 9 are provided between the electrodes 3A, 3B in contact with channel 5 of two dimensional material. The plurality of nanostructures 9 between the electrodes 3A, 3B are provided in addition to the plurality of nanostructures 9 that form part of the electrodes 3A, 3B.

In the example of FIG. 6 the nanostructures 9 that are provided between the electrodes 3A, 3B comprise a conductive core 11 and a coating 13 of two dimensional material as described above. In some examples the conductive core 11 of the nanostructures 9 that are provided between the electrodes 3A, 3B may comprise the same conductive material as is used for the conductive core 11 of the nanostructures 9 that form part of the electrodes 3A, 3B. In other examples different conductive materials could be used.

The example apparatus 1 of FIG. 6 also comprises a plurality of quantum dots 61. The plurality of quantum dots 61 are provided overlaying the channel 5 of two dimensional material in the region between the source electrode 3A and the drain electrode 3B. The plurality of quantum dots 61 are provided so that the nanostructures 9 are positioned between the quantum dots 61 and the channel 5 of two dimensional material. This may provide for improved charge transfer between the quantum dots 61 and the channel 5 of two dimensional material.

The quantum dots 61 may comprise a nanocrystal in which there is quantum confinement in all three dimensions. The quantum dots 61 may comprise any suitable semiconductive material. The material that is used for the quantum dots 61 may be chosen dependent upon the application that the apparatus 1 is to be used for. For example, if the apparatus 1 is to be used for sensing, the material that is chosen for the quantum dots 61 may depend on the parameter that is to be sensed. In some examples the quantum dots 61 may comprise lead sulphide, cadmium sulphide, cadmium selenide or any other suitable material.

The example apparatus 1 of FIG. 6 also comprises at least one ligand 63. In the example of FIG. 6 the ligands 63 are coupled to the quantum dots 61. The ligands 63 may be configured to connect the quantum dots 61 to each other. The ligands 63 may also be configured to connect the quantum dots 61 to the nanostructures 9 and/or the channel 5 of two dimensional material.

The ligands 63 may comprise any suitable material. The material or materials that are used for the ligands 63 may be chosen dependent upon the application that the apparatus 1 is to be used for, the materials used for the quantum dots 61, the materials used within the nanostructures 9 or any other suitable factor. In some examples the ligands 63 may comprise alkanedithiol; where the alkane comprises methane, ethane, propane, butane or any other suitable alkane; alkanethiol; amine such as butylamine; pyridine or any other suitable material.

The quantum dots 61 may be arranged to sense an incident parameter such as a pulse of electromagnetic radiation. The quantum dots 61 may convert the incident parameter into electrical charge. The changes in charge distribution within the quantum dots 61 may be detected by the channel 5 of two dimensional material which produces a measurable electrical response.

In some examples the quantum dots 61 may generate excitons in response to an incident parameter. The excitons may be separated into electron-hole pairs and either the holes or electrons may be removed by the channel of two dimensional material. This provides a doping effect in the channel 5 of two dimensional material so that the output of the apparatus 1 is indicative of the incident parameter.

In the examples of the disclosure the quantum dots 61 are coupled to the nanostructures 9 by the ligands 63. As the nanostructures 9 have a coating 13 of two dimensional material this increases the surface area of two dimensional material that the quantum dots 61 are connected to. Charges transferred from the quantum dots 61 to the coating 13 of the nanostructures 9 may then be transferred to the channel 5 of two dimensional material. This provides for improved charge transfer.

In some examples the nanostructures 9 may also plasmonically enhance the absorption of the incident parameter by the quantum dots 61. For example the nanostructures 9 may plasmonically enhance the absorption of photons by the quantum dots 61.

The plurality of nanostructures 9 may absorb photons by the excitation of surface plasmons on the surface of the conductive core 11. The surface plasmons are created by the interaction between the electromagnetic field of the incident photons and the free electrons within the conductive material 11.

The excitation of localized surface plasmons by incident photons results in strong light scattering by the plurality of nanostructures 9, the appearance of intense surface plasmon absorption bands and an enhancement of the local electromagnetic fields of the plurality of nanostructures 9. A localized surface plasmon resonance is generated when the wavelength of the incident photons on the plurality of nanostructures 9 is in resonance with an eigenmode of the surface plasmon resonance for the nanostructure 9. From Mie scattering theory, the resonance condition for the extinction cross-section for an incident plane wave on a nanostructure comprising a conductive material, such as metal, is satisfied when $$\mathfrak{R}\,[\varepsilon_{metal}(\lambda)]+\chi\varepsilon_{diel}=0$$

Where $\varepsilon_{metal}$ is the dielectric constant of the metal and the $\varepsilon_{diel}$ is the dielectric constant of the material which forms the boundary with the conductive material. $\chi$ is a factor which depends on the geometry of the nanostructure. The value of $\chi$ is 2 for a sphere but will be different for other shapes of particles. For instance, for nanowires with a high aspect ratio the value of $\chi$ could be as large as 20.

Materials which possess a negative real and small positive imaginary dielectric constant are capable of supporting surface plasmons. Suitable materials comprise gold, silver and platinum. However the conditions for generating the surface plasmons are only satisfied if the plasmonic material forms a boundary with a material which has a smaller magnitude for the real dielectric constant. In the examples of the disclosure the conductive core 11 of the nanostructures 9 forms a boundary with the coating 13. This enables surface plasmon resonances to be generated on the boundary between the conductive core 11 and the coating 13. The localized surface plasmon resonances enhances the local electric field in the vicinity of the nanostructure which increases the amount of photons absorbed by the quantum dots 61 and increases the efficiency of the apparatus 1. The size of the nanostructures 9 and/or the materials used for the nanostructures 9 may be selected to tune the frequency of the surface plasmons so that the frequency of the photons where the local electric field enhancement is greatest corresponds to the frequency of the photons that are to be detected by the quantum dots 61.

Figure 7:
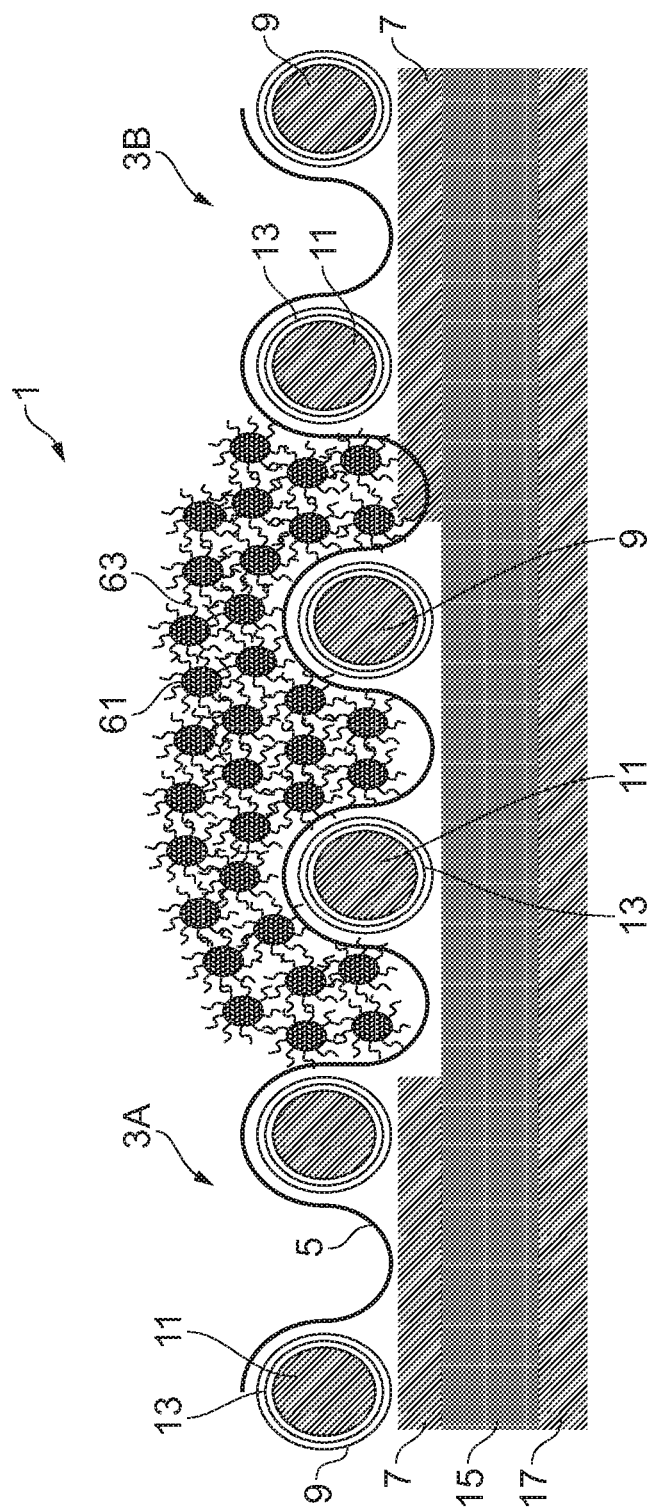
FIG. 7 illustrates another apparatus comprising quantum dots.

FIG. 7 illustrates another apparatus 1 which is similar to the apparatus 1 of FIG. 6. The example apparatus of FIG. 7 also comprises a source electrode 3A, a drain electrode 3B and a gate electrode 17 and a channel 5 of two dimensional material configured to provide a GFET with a plurality of quantum dots 61 and nanostructures 9 provided between the source electrode 3A and the drain electrodes 3B.

In the example of FIG. 7 the source electrode 3A and the drain electrode 3B comprise a single conductive layer 7 with a plurality of nanostructures 9 overlaying the single conductive layer 7. The channel 5 of two dimensional material is provided overlaying the nanostructures 9. It is to be appreciated that other arrangements of the electrodes 3A, 3B may be used in other examples of the disclosure.

In the apparatus of FIG. 7 the plurality of nanostructures 9 provided between the source electrode 3A and the drain electrodes 3B are provided on the surface of the dielectric 15. The channel 5 of two dimensional material is then provided overlaying the plurality of nanostructures 9. The quantum dots 61 and the ligands 63 are then deposited over the channel 5 of two dimensional material so that the channel 5 of two dimensional material is provided between the plurality of nanostructures 9 and the quantum dots 61.

The plurality of nanostructures 9 provided between the source electrode 3A and the drain electrode 3B may improve the efficiency of the apparatus 1 as described above.

In the example of FIG. 7 the plurality of nanostructures 9 between the source and drain electrodes 3A, 3B have a lower packing density than in the example apparatus 1 of FIG. 6.

In both the example of FIG. 6 and FIG. 7 the packing density of the nanostructures 9 between the source and drain electrodes 3A, 3B must be low enough to ensure that no conduction paths are provided between the nanostructures 9 as this would short circuit the channel 5 of two dimensional material.

In the examples of FIGS. 6 and 7 the plurality of nanostructures 9 are deposited both within the source and drain electrodes 3A, 3B and between the source and drain electrodes 3A, 3B. This may enable the apparatus 1 to be formed without the need for patterning the nanostructures 9. This may provide for a simpler fabrication process.

Figure 8:
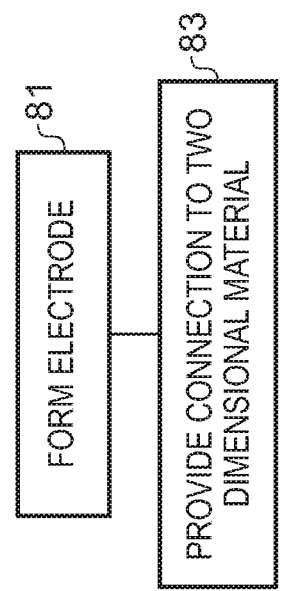
FIG. 8 illustrates a method.

FIG. 8 illustrates an example method according to examples of the disclosure. The method may be used to form an apparatus 1 such as the example apparatus 1 of FIGS. 1 to 7.

The example method comprises, at block 81, forming at least one electrode 3 wherein the electrode 3 comprises a conductive layer 7 and plurality of nanostructures 9 wherein at least some of the nanostructures 9 comprise a conductive core 11 and a coating 13 of two dimensional material. The method also comprises, at block 83, configuring the at least one electrode 3 to provide an electrical connection to a channel 5 of two dimensional material.

It is to be appreciated that the blocks of the method may be performed in any suitable order. For instance, in examples where the electrode comprises two or more conductive layers 7, such as the examples of FIGS. 5 and 6, the first conductive layer 7A of the electrodes 3 could be formed, then the channel 5 of two dimensional material can be connected to the first conductive layer 7A before the second conductive layer 7B is provided to complete the electrode 3.

It is to be appreciated that any suitable processes may be used to fabricate the apparatus 1. For example, any suitable processes may be used to deposit the nanostructures 9 over the conductive layers 7 and/or the channel 5 of two dimensional material. The suitable processes could comprise spin-coating, ink jet printing, pad printing, transfer printing, aerosol jet deposition or any other wet or dry deposition processes. The conductive layers 7 may be formed by evaporation or any other suitable technique.

Examples of the disclosure provide apparatus 1 with reduced contact resistance between a channel 5 of two dimensional material and one or more electrodes 3. The electrodes can be arranged in different configurations which may enable different fabrication methods to be used.

It is to be appreciated that different types of nanostructures 9 may be used in different examples of the disclosure. For instance, in some examples nanoparticles such as spherical nanoparticles may be selected. Such nanoparticles may be deposited using inks or aerosols which may make the apparatus 1 easier to fabricate. In other examples an elongate nanostructure 9 such as a nanowire may be selected as this provide a larger effective surface area with a fewer number of nanostructures 9.

The term "comprise" is used in this document with an inclusive not an exclusive meaning. That is any reference to X comprising Y indicates that X may comprise only one Y or may comprise more than one Y. If it is intended to use "comprise" with an exclusive meaning then it will be made clear in the context by referring to "comprising only one . . . " or by using "consisting".

In this brief description, reference has been made to various examples. The description of features or functions in relation to an example indicates that those features or functions are present in that example. The use of the term "example" or "for example" or "may" in the text denotes, whether explicitly stated or not, that such features or functions are present in at least the described example, whether described as an example or not, and that they can be, but are not necessarily, present in some of or all other examples. Thus "example", "for example" or "may" refers to a particular instance in a class of examples. A property of the instance can be a property of only that instance or a property of the class or a property of a sub-class of the class that includes some but not all of the instances in the class. It is therefore implicitly disclosed that a feature described with reference to one example but not with reference to another example, can where possible be used in that other example but does not necessarily have to be used in that other example.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

The invention claimed is:

1. An apparatus comprising:
at least one electrode configured to provide an electrical connection to a channel of two dimensional material, wherein the at least one electrode comprises a conductive layer and a plurality of nanostructures, and wherein at least some of the plurality of nanostructures comprise a conductive core and a coating of two dimensional material, and wherein the coating of two dimensional material is configured to enable electron tunnelling between the conductive layer of the at least one electrode and the conductive core of at least some of the plurality of nanostructures.

2. The apparatus of claim 1 wherein the conductive layer comprises metal.

3. The apparatus of claim 1 wherein the conductive core of at least some of the plurality of nanostructures comprises metal.

4. The apparatus of claim 1 wherein the plurality of nanostructures comprise at least one of: nanoparticles, nanowires.

5. The apparatus of claim 1 wherein the coating of two dimensional material is formed on the conductive core of at least some of the plurality of nanostructures.

6. The apparatus of claim 1 wherein the channel of two dimensional material and the coating of two dimensional material both comprise graphene.

7. The apparatus of claim 1 wherein the plurality of nanostructures are provided overlaying the conductive layer.

8. The apparatus of claim 7 wherein the channel of two dimensional material is provided overlaying the plurality of nanostructures.

9. The apparatus of claim 1 wherein the conductive layer is provided overlaying the plurality of nanostructures.

10. The apparatus of claim 9 wherein the plurality of nanostructures are provided overlaying the channel of two dimensional material.

11. The apparatus of claim 1 further comprising a first electrode and a second electrode and the channel of two dimensional material extends between the first electrode and the second electrode;
wherein the apparatus comprises a further plurality of nanostructures between the first electrode and the second electrode; and
wherein at least some of the further plurality of nanostructures are in contact with the channel of two dimensional material.

12. The apparatus of claim 1 wherein the apparatus comprises quantum dots.

13. The apparatus of claim 12 wherein the quantum dots are provided overlaying the channel of two dimensional material in a region between the first electrode and the second electrode.

14. A sensing device comprising:
at least one electrode configured to provide an electrical connection to a channel of two dimensional material, wherein the at least one electrode comprises a conductive layer and a plurality of nanostructures, and wherein at least some of the plurality of nanostructures comprise a conductive core and a coating of two dimensional material, and wherein the coating of two dimensional material is configured to enable electron tunnelling between the conductive layer of the at least one electrode and the conductive core of at least some of the plurality of nanostructures.

* * * * *